(12) United States Patent
Unno (10) Patent No.: US 7,251,712 B2
(45) Date of Patent: Jul. 31, 2007

(54) SEMICONDUCTOR MEMORY DEVICE (75) Inventor: Yusaku Unno, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 498 days.

(21) Appl. No.: 10/859,542

(22) Filed: Jun. 3, 2004

(65) Prior Publication Data

US 2004/0255089 A1 Dec. 16, 2004

(30) Foreign Application Priority Data

Jun. 12, 2003 (JP) ............................. 2003-167656

(51) Int. Cl.
*G06F 12/00* (2006.01)
(52) U.S. Cl. .................................... 711/154
(58) Field of Classification Search ................ 711/102, 711/103, 154; 714/6
See application file for complete search history.

(56) References Cited

U.S. PATENT DOCUMENTS

| | | | | |
|---|---|---|---|---|
| 4,601,031 A | * | 7/1986 | Walker et al. ............... 714/711 |
| 5,402,376 A | * | 3/1995 | Horiguchi et al. ........... 365/200 |
| 5,841,699 A | * | 11/1998 | Miyauchi ................ 365/185.33 |
| 5,892,713 A | * | 4/1999 | Jyouno et al. .......... 365/185.11 |
| 6,360,293 B1 | * | 3/2002 | Unno .......................... 711/103 |
| 2003/0051093 A1 | * | 3/2003 | Takeuchi ..................... 711/103 |
| 2005/0289389 A1 | * | 12/2005 | Yamagami et al. ............. 714/8 |

\* cited by examiner

*Primary Examiner*—Hiep T. Nguyen
(74) *Attorney, Agent, or Firm*—Takeuchi & Kubotera, LLP (57) ABSTRACT

The logic format of a mask ROM (10) is composed of a user region (11) having a plurality of blocks, a spare region (12) having a plurality of blocks, and a table region (13) having a plurality of blocks. When the outside data is written in the mask ROM by the control of a MPU (24), if there is a defective block in the user region, the defective block is replaced by a spare block in the spare region. If the spare block is defective, it is replaced by another spare block. The replacement information (address, et.) is stored in a block in the table region, and if the block of the table region is defective, it is replaced by another block. Accordingly, since a defective block in the mask ROM (10) is replaced by another block, a defective mask ROM is relieved.

14 Claims, 5 Drawing Sheets

SEMICONDUCTOR MEMORY DEVICE

BACKGROUND OF THE INVENTION

1. Field of the Invention

The present invention relates to a semiconductor memory device, such as a memory card incorporating a mask ROM as a read only memory (hereinafter "ROM"), especially a semiconductor memory device, of which defective part produced at the time of writing in the ROM is replaced by normal part to reduce the fraction defective and increase the production yield.

2. Description of the Related Art

Japanese Patent Application Kokai Numbers 8-115175 and 2000-10870 disclose a conventional semiconductor memory device having a remedy of defective part.

The technology of a semiconductor disk, which is one of the semiconductor memory device, is disclosed in these references. The semiconductor disk comprises a readable/writable non-volatile flash memory. When defective part is produced in the flash memory during writing or reading of data, the defective part is replaced by normal part to reduce the fraction defective and increase the production yield.

However, it is a defective remedy technology for the flash memory. There has been no appropriate semiconductor memory device, such as a read only memory card incorporating a ROM, having a defective remedy means. The flash memory with a large memory capacity is expensive because of its sophisticated structure. By contrast, the read only semiconductor memory device is not expensive and easy to increase the memory capacity because of its simple structure. Accordingly, a defective remedy for the read only semiconductor device has been demanded.

SUMMARY OF THE INVENTION

In order solve the problem, according to the present invention, a semiconductor memory device, such as a memory card, comprises an interface for sending and receiving data to and from an outside, at least one buffer for storing the data temporarily, a read only memory section being capable of reading data by the block, a substitute information storing means provided in or outside the read only memory section, and a controlling means for controlling the interface, buffer, read only memory section, and substitute information storing means according to a control signal generated in the controlling means or supplied from the outside.

The read only memory section comprises a user region having a plurality of user blocks, each of the user blocks composed of a plurality of bits for storing the data from the outside (hereinafter "the outside data") and a spare region having a plurality of spare blocks, each of the spare blocks composed of a plurality of bits for storing the outside data instead of a defective user block in the user region. The substitute information storing means has a plurality of blocks each composed of a plurality of bits for storing substitute information representing the substitution of the spare block for the defective user block.

When any of the user blocks becomes the defective block because of an error during writing the outside data in the user region, the outside data is written in one of the spare blocks instead of the defective user block and the substitute information is written in the block of the substitute information storing means. When the one of the spare blocks is unusable during writing the outside data in the spare block, the outside data is written in another spare block and writing information is written in block in the substitute information storing means. When the block of the substitute information storing means becomes unusable during writing the substitute information or the writing information in the block, the substitute information or the wiring information is written in another block of the substitute information storing means. Consequently, the fraction defective is relieved and the production yield increases.

DESCRIPTION OF THE PREFERRED EMBODIMENTS (Construction)

Figure 1:
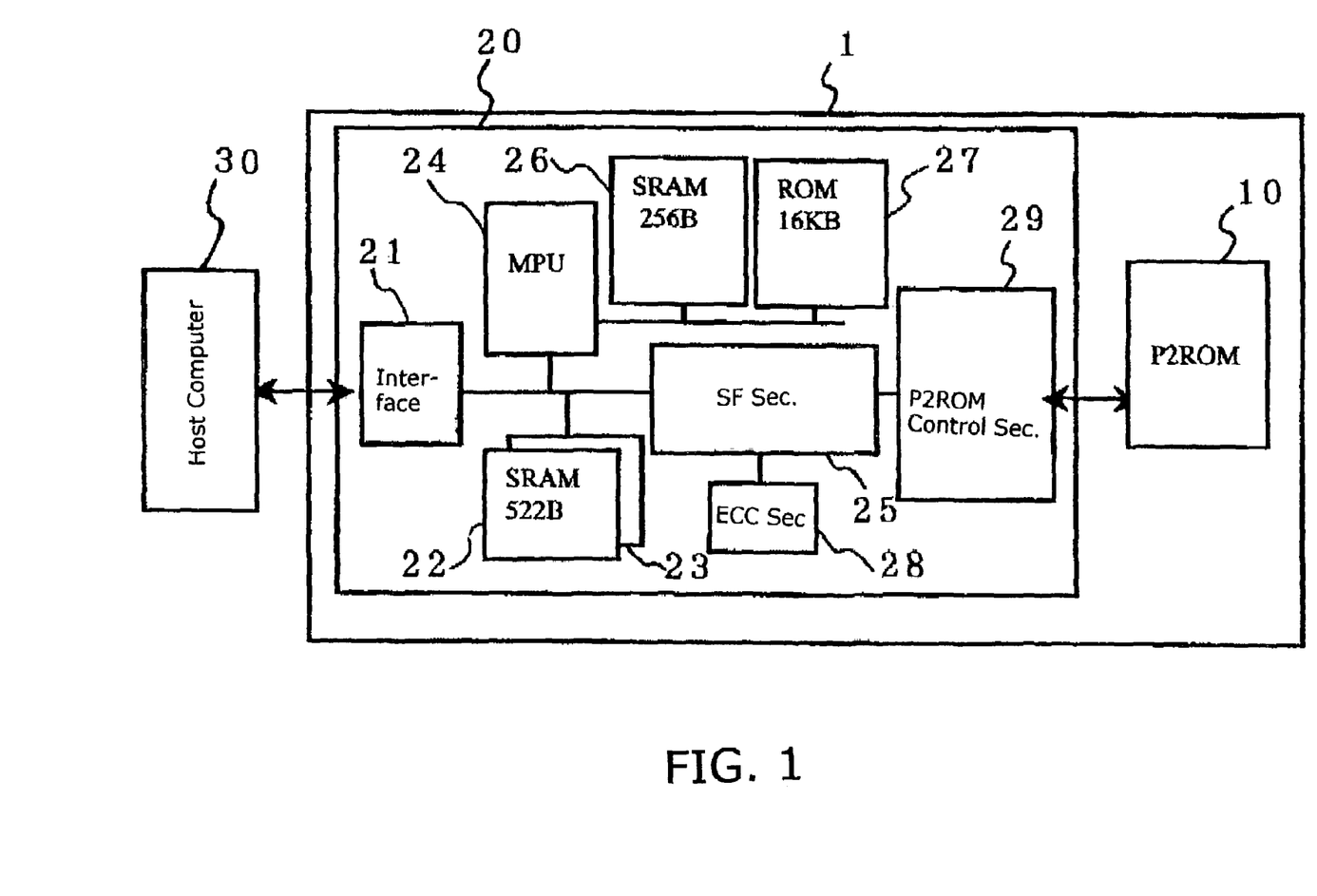
FIG. 1 a block diagram of a semiconductor memory device according to an embodiment of the present invention.

A semiconductor memory device according to the present invention shown in FIG. 1 is, for example, a memory card, such as an SD card and an MMC (multimedia) card. The semiconductor memory device comprises a card-like board 1, a read only memory section 10 for reading data by the block (for example, a one-chip mask ROM (hereinafter "P2ROM")), and a card controller 20 for access-controlling the P2ROM 10 according to a program. The P2ROM 10 has, for example, 256 Mb or 128 Mb memory capacity and is connected to the card controller 20 through signal wires (bus).

The card controller 20 access-controls the P2ROM 10 according to the instruction from a host device 30 (for example, a host computer) and comprises an interface 21 to input/output data to/from the host computer 30. The interface 21 is connected to double buffers which store the data temporarily. The double buffers are composed of, for example, two static random access memories 22 and 23 (hereinafter "SRAM") with 522 B memory capacity and capable of simultaneously transmitting data from the card controller 20 to the host computer 30 and data from the P2ROM 10 to the card controller 20.

The interface 21 is further connected to a micro processor unit (hereinafter "MPU") 24 for program-controlling the whole memory card and a sequencer/formatter (herein after "SF section") 25 for performing sequential control and initial setting. The MPU 24 is connected to a data memory (for example, 256 B SRAM) 26 and a program memory (for example, 16 KB ROM) 27, both of which are accessed by the MPU 24. The SRAM 26 stores working data by which the MPU 24 executes a program. The ROM 27 stores a program for the access.

An ECC (error checking and correction) section 28 and a P2ROM control section 29 are connected to the SF section 25. The ECC section 28 checks and corrects an error of data which is read in the P2ROM 10 and creates redundancy data. The P2ROM control section 29 access-controls the P2ROM 10. The MPU 24, the SF section 25, the ECC section 28, and the P2ROM control section 29 compose a controlling means (for example, a control section) for program-controlling the interface 21, the SRAMs 22 and 23, and the P2ROM 10.

Figure 2:
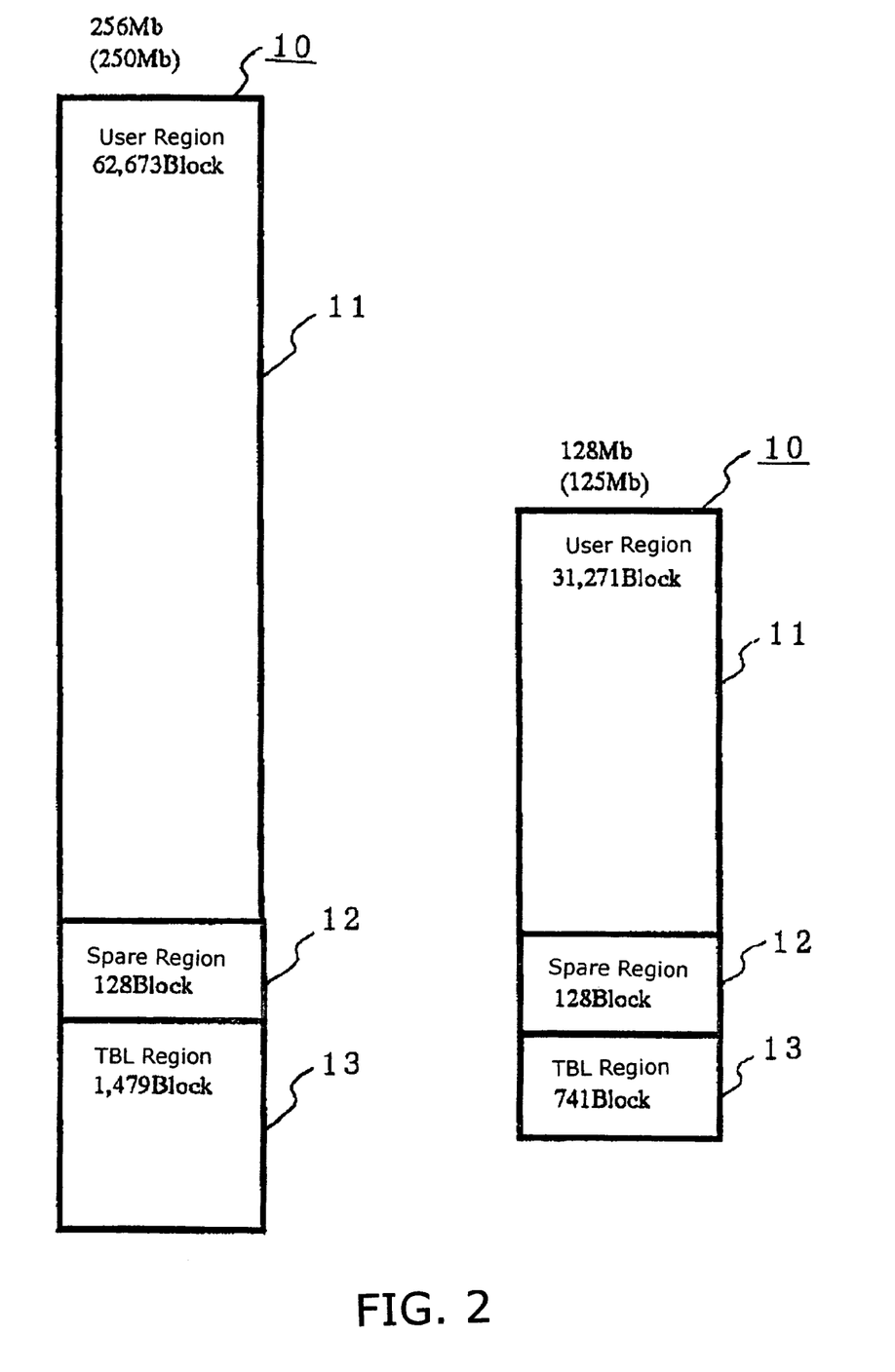
FIG. 2 is an illustration of an example of a logic format of P2ROM of FIG. 1.

In FIG. 2, a logic format of the P2ROM 10 is composed of, for example, 256 Mb or 128 Mb and comprises a user region 11 having a plurality of blocks (62,673 blocks or 31,271 blocks) for storing outside data (user data), a spare region 12 having a plurality of spare blocks (128 blocks) for taking place of a defective block in the user region 11 and storing the outside data (user data), and an substitute information storing means 13 (for example, table (TBL) region) having a plurality of blocks (1,479 blocks or 741 blocks) for storing substitute information on the substitute of the spare block for the defective block. The substitute information includes, for example, an address of the spare block corresponding to the defective block.

Each of blocks of the respective regions 11, 12, and 13 is composed of, for example, 264 words (corresponding to "sector" of a semiconductor disk) and each word is composed of 16 bit. Each block is composed of a header section of a plurality of bits for storing a code indicating effectiveness (for example, Good or Bad) and a data section of a plurality of bits for storing data accessed from the host computer 30 and error-check/correction information.

(Write Operation)

Figure 3:
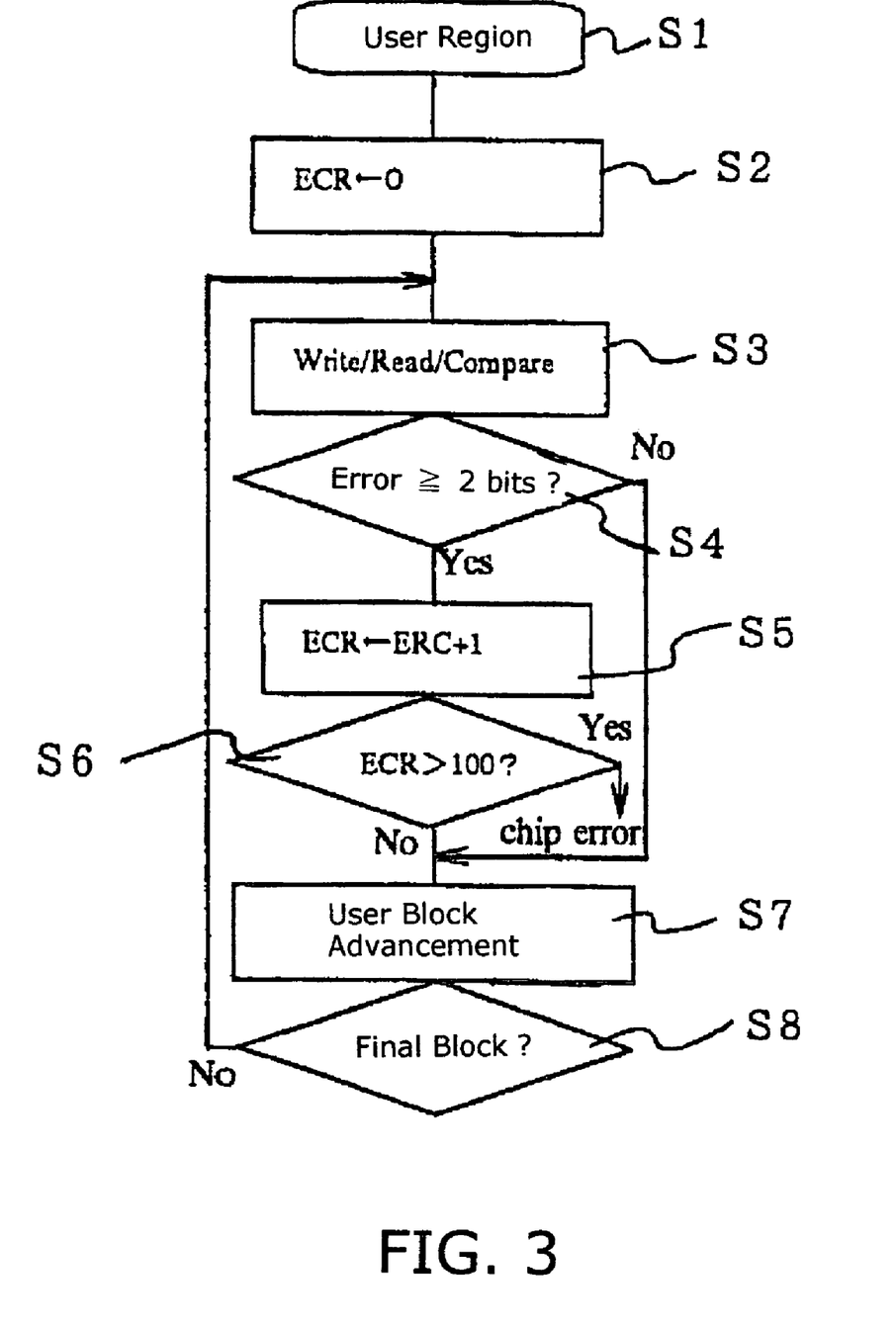
FIGS. 3-5 are flow charts of a write operation of the semiconductor memory device of FIG. 1.
Figure 4:
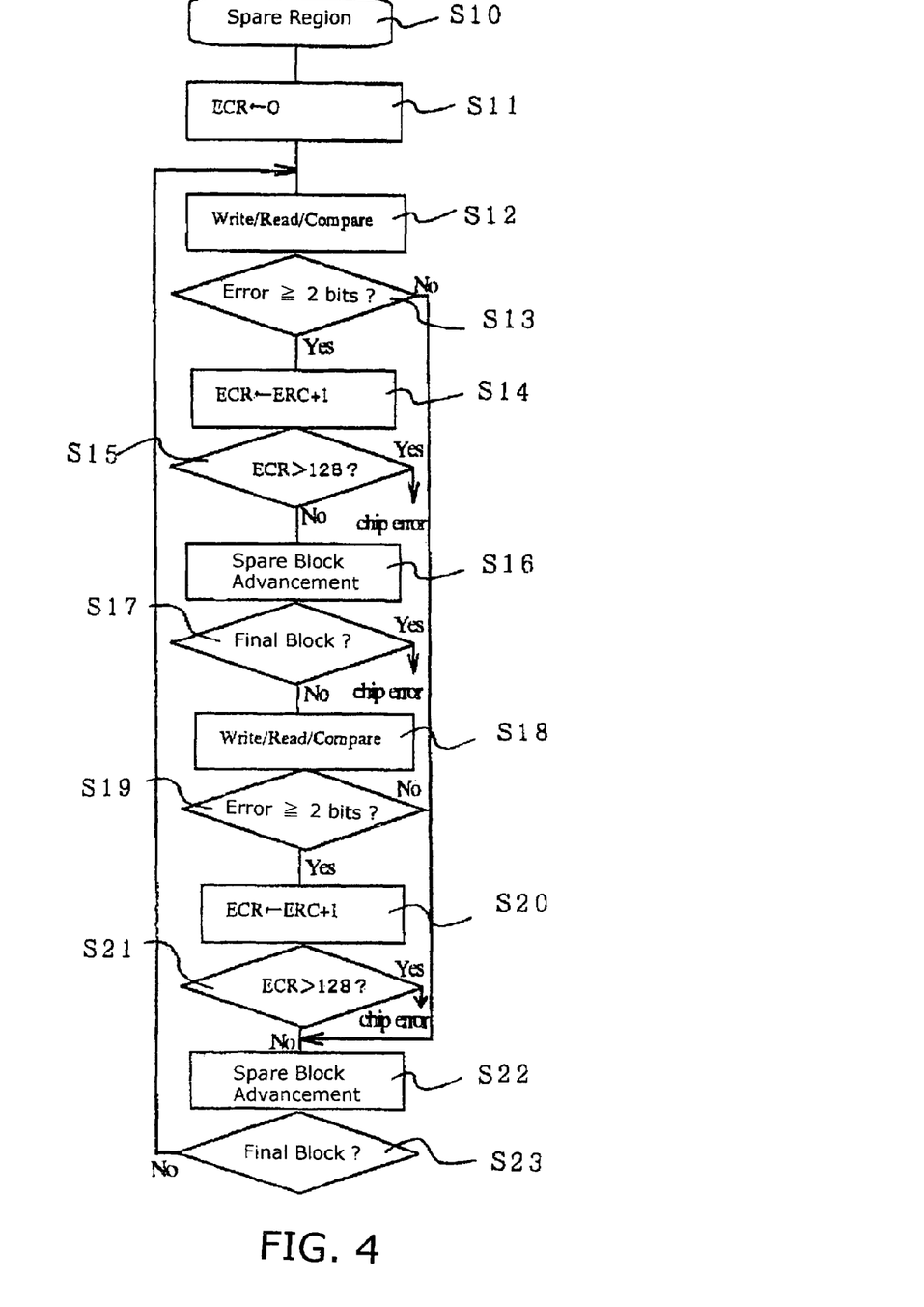
Figure 5:
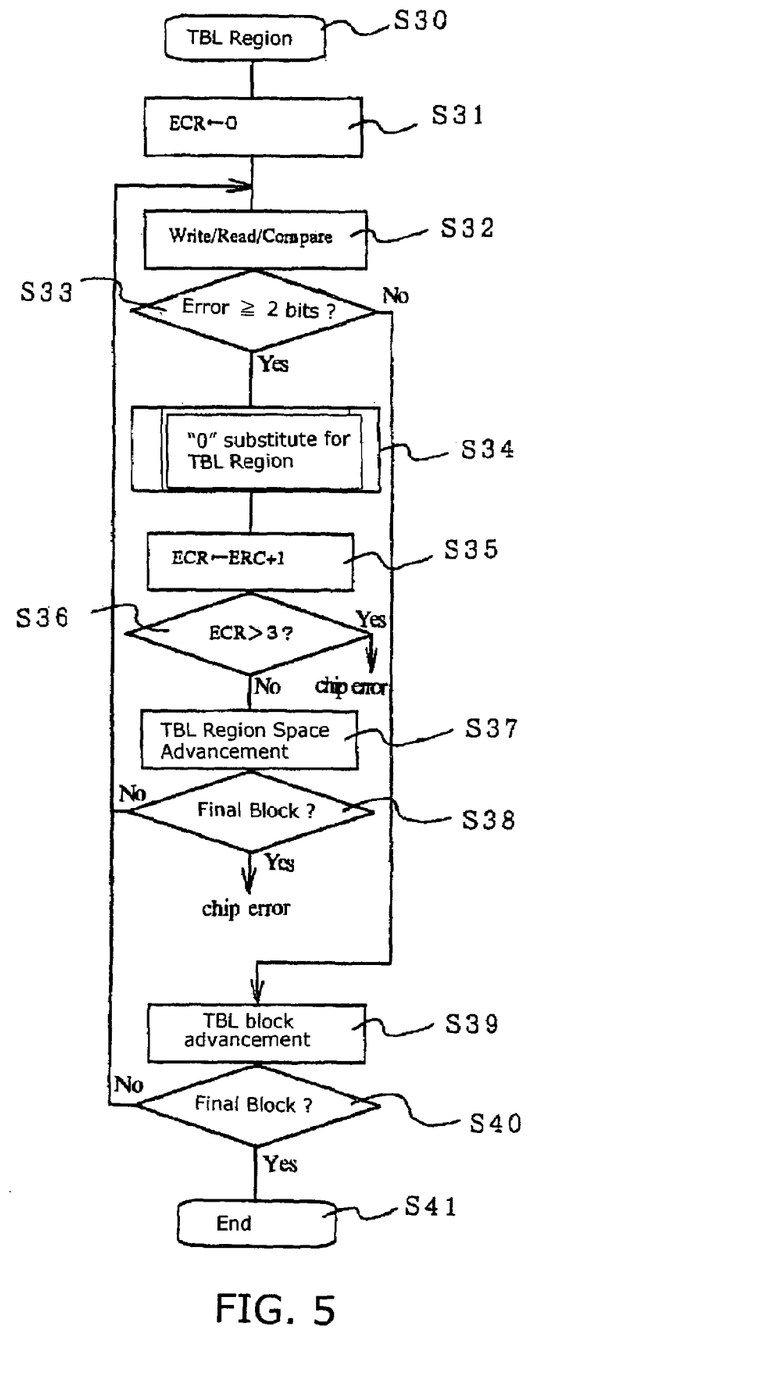

FIG. 3 is a flow chart of the user region 11 in the P2ROM 10, FIG. 4 is a flow chart of the spare region 12, and FIG. 5 is a flow chart of the TBL region 13.

The write operations of the respective regions 11, 12, and 13 will be described.

(1) Write Operation of the User Region 11 (FIG. 3)

In a step S1, the write process begins when address and write control signals, write data (data to be written) and so forth are supplied to the semiconductor memory device of FIG. 1 from the outside in synchronization with a clock signal, using a writing unit, such as the host computer 30. The signals and data supplied from the writing unit are inputted through the interface 21 in the semiconductor memory device. The inputted write data is temporarily stored in the SRAM 22 and 23 by the MPU 24.

In a step S2, a register (ECR) in the MPU 24 for counting the quantity of the defective blocks is initialized to zero, then the process advances to a step S3. In the step S3, the inputted write address is converted into the format and a write control signal, such as a chip enable signal and an input enable signal, is created in the corresponding SF section 25 by the control of the MPU 24. The address converted into the format and the write control single are supplied to the P2ROM 10 through the P2ROM control section 29. Then, a write address is designated in the P2ROM 10 and the data stored in the SRAMs 22 and 23 is written in the write address by the block. The written data is read and compared in the ECC section 28 for error-check. Then, the process advances to a step S4.

In the step S4, it is judged if there is an error equal to or more than a predetermined quantity of bits (for example, 2 bits) in a block according to the comparison result in the step S3. If the judgement is No, the process advances to a step S7, and the judgement is Yes, the process advances to a step S5. In the step S5, one count of the defective blocks (ERC) is added in the register (ECR). In a step S6, it is judged by the MPU 24 if the quantity of the defective blocks in the register (ECR) is equal to or more than a predetermined quantity (for example 100). If the judgement is Yes, the P2ROM 10 is judged as a chip error, and if the judgement is No, the P2ROM 10 is judged as a good chip. Then, the process advances to the step S7.

In the step S7, the write operation advances to a block of the next address in the user region 11, and in a step S8, it is judged if the block is final. If the judgement in the step S8 is No, the process returns to the step S3 and repeats the steps S3-S8. If the judgement is Yes (final block), the write operation is completed.

(2) Write Operation in the Spare Region 12 (FIG. 4)

In the step S4 of FIG. 3, if there is an error equal to or more than a predetermined quantity of bits (for example, 2 bits) in a block, the writing process in the spare region 12 begins by the control of the MPU 24 in a step S10. That is, data in the block having such an error is written in the spare region 12. In a step S11, the number in the register (ECR) in the MPU 24 is initialized to zero as the initial number of the defective blocks, and the process advances to a step S12. In the step S12, the data is written in the block in the spare region 12 and the written data is read and compared with the write data to check if the data has been written correctly. Then, the process advances to a step S13.

In the step S13, it is judged if there is an error equal to or more than a predetermined quantity of bits (for example, 2 bits) in a block. If the judgement is No, the data is considered to have been written correctly and the process advances to a step S22 for advancement to the next spare region block. That is, in the step S22, an address counter in the SF section 25 advances the address to an address of the next block and the writing process in the spare region 12 is completed through a step S23.

If the judgement in the step S13 is Yes, in a step S14, one count of the defective block (ERC) is added in the register (ECR) to write in a block of the next address. Then, the process advances to a step S15. In the step S15, it is judged if the quantity of the defective blocks stored in the register (ECR) is equal to or more than a predetermined quantity (for example 128). If the judgement is Yes, the P2ROM 10 is judged as a chip error, and if the judgement is No, in a step S16, the address counter in the SF section 25 advances the address to an address of the next block. Then, the process advances to the step S17. In the step S17, it is judged if the block is final. If the judgement is Yes, the P2ROM 10 is judged as a chip error and if the judgement is No, the data is written in a step S18 and the written data is read and compared with the write data. Then, the process advances to a step S19.

In the step S19, it is judged if there is an error equal to or more than a predetermined quantity of bits (for example, 2 bits) in a block. If the judgement is No, the data is considered to have been written correctly and the process advances to a step S22 for advancement to the next spare region block. That is, in the step S22, the address counter in the SF section 25 advances the address to an address of the next block, and the writing process in the spare region 12 is completed through the step 23.

If the judgement in the step S19 is Yes, in a step S20, one count of the defective block (ERC) is added in the register (ECR) so as to write in a block in the next address. Then the process advances to a step S21. In the step 21, it is judged if the quantity of the defective blocks stored in the register (ECR) is equal to or more than a predetermined quantity (for example, 128). If the judgement is Yes, the P2ROM 10 is taken as a chip error and if the judgement is No, the address counter in the SF section 25 advances the address to an address of the next block. Then, the process advances to a step S23. In the step S23, it is judged if the block is final and if the judgement is Yes, the writing process in the spare region 12 is completed, and if the judgement is No, the process returned to the step S12 and repeats the steps S12-S23.

(3) Writing Operation in the Table (TBL) Region 13 (FIG. 5)

When data is written in the spare block in FIG. 4, the writing operation in the table region 13 begins by the control of the MPU 24 at a step S30 so as to write substitute information (for example, the address of the spare block) in the table region 13. In a step S31, the number in the register (ECR) in the MPU 24 is initialized to zero for the initial quantity of the defective block, and the process advances to a step S32. In the step S32, the substitute information is written in the block in the table region 13, and the written substitute information is read and compared with the write information (information to be written) to check if the substitute information has been written correctly. Then, the process goes to a step S33.

In the step S33, it is judged if there is an error equal to or more than a predetermined quantity of bits (for example, 2 bits) in a block. If the judgement is No, it is considered that the information has been written correctly, and the process advances to a step S39 for advancement to the next table region block. That is, the address advances to an address of the next block. Then, the process is finished at a step S41 through a step S40.

In the step S33, if the judgement is Yes, in a step S34, for example, "0" is substituted for the defective block having the error equal to or more than the predetermined quantity of bits to prohibit the use of the defective block. Then, in a step S35, one count of the defective block quantity (ERC) is added in the register (ECR) to write in a block in the next address and the process advances to a step S36. In the step S36, it is judged if the quantity of the defective blocks (ERC) stored in the register (ECR) is equal to or more than a predetermined number (for example, three). If the judgement is Yes, the P2ROM 10 is taken as a chip error and if the judgement is No, the process advances to a step S37, wherein the address counter in the SF section 25 advances the address to an address of the next block in the table region. Then, the process advances to a step S38, wherein it is judged if the block is final. If the judgement is Yes, the P2ROM 10 is taken as a chip error and if the judgement is No, the process returns to the step S32 and repeats the steps S32-S33.

In the step 33, if the judgement is No, which means that the writing operation is normal, the process advances to a step S39 so as to advance to an address of the next block by the address counter in the SF section 25. Then, the process advances to a step S40, wherein it is judged if the block is final. If the judgement is Yes, the writing process is completed at a step S41, and if the judgement is No, the process returns to the step S32 and repeats the steps S32-S40.

(Read Operation)

When an address, a read control signal and so forth are supplied from the outside host computer 30 to the semiconductor memory device of FIG. 1 in synchronization with a clock signal, a read control signal, such as a chip-enable signal, an output-enable signal, is generated in the SF section 25 by the control of the MPU 24. Also, an address, which has been converted into the format, is created in the SF section 25. These address and read control signal are supplied to the P2ROM 10 through the P2ROM control section 29.

Then, a read address is designated in the P2ROM 10, that is, the address of the spare block corresponding to the defective user block, which is stored in the table block, is designated, and data stored in the address is read by the block. The read data is subject to the error check in the ECC section 28. If there is an error, the error is corrected and temporarily stored in the SRAMs 22 and 23. Since the SRAMs 22 and 23 are of double-buffer structure, data which is read in the P2ROM 10 is stored in one of the SRAMs (for example, 22), and, at the same time, data which has been already stored in the other SRAMs (for example, 23) is transferred to the host computer 30 through the interface 21. Therefore, high-speed reading of data is possible.

(Effects)

The following effects are provided by the embodiment.

(a) The logic format of the P2ROM 10 is composed of the user, spare, and table regions 11, 12, and 13. If there is a defective block in the user region 11 during writing operation, the defective block is replaced by a spare block in the spare region 12, and if the spare block is defective, the defective spare block is replaced by another spare block. These replacement or substitute information (address and so fourth) is stored in a block in the table region 13 and if the table block is defective, it is replaced by another table block for storing the substitute information. Thus, even if there is a defective block in the P2ROM, it is replaced by another block. Accordingly, the defective P2ROM 10 is relieved, which results in large reduction of the fraction defective and increase of the production yield. Consequently, it is possible to provide a read only semiconductor memory device with large capacity at low cost.

(b) Since the SRAMs 22 and 23 have a double-buffer structure, for example, two operations, such as the transfer of read data from the SRAM 23 to the host computer 30 and transfer of read data from the P2ROM 10 to the SRAM 22, can be done simultaneously during reading data. Consequently, high-speed read operation is possible.

(Application)

The present invention is not limited to the above embodiments and various modifications including the below-mentioned modifications are possible.

(a) The capacities of the SRAMs 22, 23, and 26 and the ROM 27 of FIG. 1, and the capacity and the logic format of the P2ROM 10 of FIG. 2 may be changed. The P2ROM 10 may be replaced by another nonvolatile memory device. The information stored in the table region 13 in the P2ROM 10 may be stored in an alternative information storing means, such as the SRAM 26 provided outside the P2ROM 10, to make small the capacity of the P2ROM 10.

(b) The card controller 20 of FIG. 1 may have other structures. For example, the MPU 24 may be constructed of logic circuits, etc. Also, in order to simplify the structure of the semiconductor memory device, the MPU 24 or the logic circuits may be eliminated and, instead, the control signal inputted from the host computer 30 through the interface 21 is stored in the controlling means, such as the SRAM 26, and the controlling means access-controls the P2ROM 10 and whole semiconductor memory device.

(c) The operational flow charts of FIGS. 3-5 may be modified by omitting or simplifying overlapped steps or adding other steps.

(d) The memory card is illustrated as an example of the semiconductor memory device in the above embodiments. However, substantially same effects can be obtained even when the P2ROM 10 and the card controller 20 of FIG. 1 are mounted on a printed board and incorporated in another unit.

(Effects of the Invention)

As fully described above, according to the present invention, since the user, spare, and substitute information storing means are provided, if there is a defective block in the user region during writing data, the defective block is replaced by a spare block in the spare region, and if the spare block is defective, the defective spare block is replaced by another spare block, and these replacement or substitute information is stored in a block in the substitute information storing means, wherein if the block in the substitute information means is defective, it is replaced by another block in the substitute information storing means for storing the substitute information. Thus, even if there is a defective block in the memory section and the substitute information storing means, the defective block is replaced by another block. Accordingly, the defective memory section and the substitute information storing means are relieved, which results in large reduction of the fraction defective and increase of the production yield. Consequently, it is possible to provide a read only semiconductor memory device with large capacity at low cost.

The invention claimed is:

1. A semiconductor memory device comprising:
an interface for sending and receiving data to and from an outside;
at least one buffer for storing said data temporarily;
a read only memory section capable of reading the data by a block and comprising a user region having a plurality of user blocks, each of said user blocks composed of a plurality of bits for storing said data from said outside (hereinafter "said outside data") and a spare region having a plurality of spare blocks, each of said spare blocks composed of a plurality of bits for storing said outside data instead of a defective user block in said user region;
substitute information storing means having a plurality of blocks, each of said blocks composed of a plurality of bits for storing substitute information describing a substitution of said spare block for said defective user block; and
controlling means for controlling said interface, buffer, read only memory section, and substitute information storing means such that when any of said user blocks becomes defective because of an error produced during writing said outside data in said user region, said outside data is written in one of said spare blocks instead of said defective user block and said substitute information is written in one of the blocks in said substitute information storing means, when said one of said spare blocks becomes unusable during writing said outside data, said outside data is written in another spare block and writing information describing a substitution of the another spare block for the unusable spare block is written in one of said blocks of said substitute information storing means, and when said one of said blocks becomes unusable during writing said substitute information or said writing information in said one of said blocks, said substitute information or said writing information is written in another block of said substitute information storing means.

2. The semiconductor memory device according to claim 1, wherein said substitute information storing means is provided in said read only memory section.

3. The semiconductor memory device according to claim 1, wherein said substitute information storing means is provided outside said read only memory section.

4. The semiconductor memory device according to claim 1, wherein said controlling means is a control section which generates a control signal to control said interface, buffer, read only memory section, and substitute information storing means.

5. The semiconductor memory device according to claim 1, wherein said controlling means receives a control signal from an outside through said interface to control said interface, buffer, read only memory section, and substitute information storing means.

6. The semiconductor memory device according to claim 1, wherein said user block is judged as said defective user block when said user block has an error equal to or more than a predetermined quantity of bits so as to write said outside data in said spare block, and said read only memory section is judged as a defective product when a quantity of said error exceeds a predetermined quantity of occurrence.

7. The semiconductor memory device according to claim 1, wherein said spare block is judged as unusable when said spare block has an error equal to or more than a predetermined quantity of bits so as to write said outside data in said another spare block, and said read only memory section is judged as a defective product when a quantity of said error exceeds a predetermined quantity of occurrence.

8. The semiconductor memory device according to claim 1, wherein said block of said substitute information storing means is judged as unusable when said spare block has an error equal to or more than a predetermined quantity of bits so as to write said substitute information or said writing information in said another block of said substitute information storing means, and said read only memory section is judged as a defective product when a quantity of said error exceeds a predetermined quantity of occurrence.

9. The semiconductor memory device according to claim 1, wherein said interface, buffer, read only memory section, substitute information storing means, and controlling means are mounted in a board.

10. The semiconductor memory device according to claim 1, wherein said interface, buffer, read only memory section, and substitute information storing means are mounted in a board.

11. A semiconductor memory device comprising:
an interface for receiving data;
a buffer for temporarily storing the data;
a memory section for storing the data, said memory section including a user region having a user block and a spare region having a first spare block and a second spare block;
a substitute information storing section having a first substitute block and a second substitute block; and
a controlling section for controlling the interface, the buffer, the memory section, and the substitute information storing section so that the data is written in the user block when the user block is not defective, the data is written in the first spare block when the user block is defective and first substitution information describing substitution of the user block with the first spare block is written in the first substitute block, the data is written in the second spare block when the first spare block is defective and second substitution information describing substitution of the first spare block with the second spare block is written in the first substitute block, and the first substitution information and the second substitution information are written in the second substitute block when the first substitute block is defective.

12. The semiconductor memory device according to claim 11, wherein said substitute information storing section is disposed in the memory section.

13. The semiconductor memory device according to claim 11, wherein said controlling section receives a control signal through the interface to control the interface, the buffer, the memory section, and the substitute information storing section.

14. The semiconductor memory device according to claim 11, further comprising a board for mounting the interface, the buffer, the memory section, and the substitute information storing section thereon.

* * * * *